(12) United States Patent
Clevenger et al.

(10) Patent No.: US 7,456,099 B2
(45) Date of Patent: Nov. 25, 2008

(54) METHOD OF FORMING A STRUCTURE FOR REDUCING LATERAL FRINGE CAPACITANCE IN SEMICONDUCTOR DEVICES

(75) Inventors: Lawrence A. Clevenger, LaGrangeville, NY (US); Stephan Grunow, Wappingers Falls, NY (US); Kaushik A. Kumar, Beacon, NY (US); Kevin S. Petrarca, Newburgh, NY (US); Vidhya Ramachandran, Ossining, NY (US); Theodorus E. Standaert, Pine Bush, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 11/420,253

(22) Filed: May 25, 2006

(65) Prior Publication Data

US 2007/0275552 A1 Nov. 29, 2007

(51) Int. Cl.
*H01L 21/4763* (2006.01)
*H01L 21/44* (2006.01)

(52) U.S. Cl. ............ 438/637; 438/671; 438/672; 438/675; 438/700; 438/717; 257/E21.231

(58) Field of Classification Search ................ 438/618, 438/622, 629, 637, 671, 672, 675, 700, 717, 438/736
See application file for complete search history.

(56) References Cited

U.S. PATENT DOCUMENTS

| 6,107,183 | A | 8/2000 | Sandhu et al. | 438/622 |
| 6,124,176 | A | 9/2000 | Togo | 438/305 |
| 6,593,639 | B2 | 7/2003 | Yach et al. | 257/532 |
| 6,774,421 | B2 | 8/2004 | Kao et al. | 257/300 |
| 6,841,463 | B1 | 1/2005 | Sandhu et al. | 438/622 |
| 2004/0097013 | A1 | 5/2004 | Lur et al. | 438/118 |

*Primary Examiner*—Hsien-ming Lee
(74) *Attorney, Agent, or Firm*—Cantor Colburn LLP; Lisa U. Jaklitsch

(57) ABSTRACT

A semiconductor structure includes a plurality of conductive lines formed within an interlevel dielectric (ILD) layer and a non-planar cap layer formed over the ILD layer and the conductive lines, wherein the cap layer is raised with respect to the conductive lines at locations between the conductive lines.

8 Claims, 5 Drawing Sheets

METHOD OF FORMING A STRUCTURE FOR REDUCING LATERAL FRINGE CAPACITANCE IN SEMICONDUCTOR DEVICES

BACKGROUND

The present invention relates generally to semiconductor device processing techniques, and, more particularly, to a stricture for reducing lateral fringe capacitance in semiconductor devices and a method of forming the same.

The continuing trend in the semiconductor industry of forming more and more circuit devices into a given area has resulted in significant improvements in both the performance of individual integrated circuits and of electronic devices that employ integrated circuits. In a typical integrated circuit, individual circuit elements or groups of elements are generally electrically connected to one another by a metallization process, in which layers of metal are deposited and patterned to form metal lines which complete the circuit as designed. Individual metal lines formed within patterned metal layers are insulated from one another by layers referred to as interlevel dielectrics. These interlevel dielectrics insulate the metal lines from any undesired electrical contact with other metal lines (whether located in the same or another metal layer, and with other circuit elements.

A typical dual-damascene structure is fabricated by depositing a dielectric material, defining the lines and vias through lithography and etching, then metallizing to fill the patterned lines and vias, the polishing the excess metal to completed lines. After chemical mechanical polishing (CMP), the surface is nearly flat and the current carrying lines are isolated from adjacent lines to complete the circuitry. At this point, the copper metal layer is typically capped and a subsequent dielectric layer is deposited.

However, one undesirable side effect of the increasing density of integrated circuits described above is a parasitic lateral capacitance between adjacent metal lines in a given metal layer. This unneeded capacitance slows circuit performance by causing too much buildup of charge where none is needed, thereby slowing the buildup of charge at circuit elements where it is needed.

FIG. 1 illustrates a cross sectional view of partially formed, conventional integrated circuit device 100. An interlevel dielectric (ILD) layer 102, such as silicon dioxide (SiO2) for example, has a plurality of conductive metal lines 104 formed therein. After a planarizing step used to polish the metal fill material 104 down to the top of the ILD layer 102, a dielectric cap layer 106 such as NBLoK (nitrogen-doped silicon carbide) is formed thereupon. Whereas the dielectric constant of the ILD layer 102 is on the order of about 2.5-3.0, the dielectric constant of the NBLoK cap layer 106 is about 6.0.

The lateral capacitance (C) between adjacent metal lines 104 of the structure 100 is influenced by several factors, two of which are: (1) the capacitance due to the ILD material 102 between the lines 102 and (2) the fringe capacitance as a result of the overlaying NBLoK cap 106. Although the capacitance contribution due to the ILD material 102 can be lowered by replacing silicon dioxide with a lower-k dielectric, it is much tougher to simply replace the NBLoK cap layer, as such a layer serves multiple functions that make it tough to replace as a material.

Accordingly, it would be desirable to be able to reduce the fringe contribution of lateral capacitance in metal lines in a manner that retains the benefits of using a higher dielectric constant capping layer.

SUMMARY

The foregoing discussed drawbacks and deficiencies of the prior art are overcome or alleviated by a method for forming a semiconductor structure. In an exemplary embodiment, the method includes defining a plurality of conductive lines within an interlevel dielectric (ILD) layer having a hardmask layer formed thereon, and recessing fill material of the conductive lines to a level below the top of the ILD layer. A protective insulation layer is formed over the top of the recessed fill material, and a domed pattern is defined within the hardmask layer, thereby removing the protective insulation layer. The hardmask layer is removed so as to transfer the domed pattern into the top of the ILD layer, and a cap layer is formed over the ILD layer and the conductive lines, wherein the cap layer takes the form of the domed pattern.

In another embodiment, a semiconductor structure includes a plurality of conductive lines formed within an interlevel dielectric (ILD) layer and a non-planar cap layer formed over the ILD layer and the conductive lines, wherein the cap layer is raised with respect to the conductive lines at locations between the conductive lines.

BRIEF DESCRIPTION OF THE DRAWINGS

Referring to the exemplary drawings wherein like elements are numbered alike in the several Figures.

DETAILED DESCRIPTION

Disclosed herein is a method and structure for reducing the fringe component of lateral capacitance between metal lines of a semiconductor device. Briefly stated, a domed cap structure is formed such that a higher-k cap layer is physically arched away from the top of the metal lines at the locations between the lines themselves, thereby decreasing the overall lateral capacitance of the device.

Figure 2:
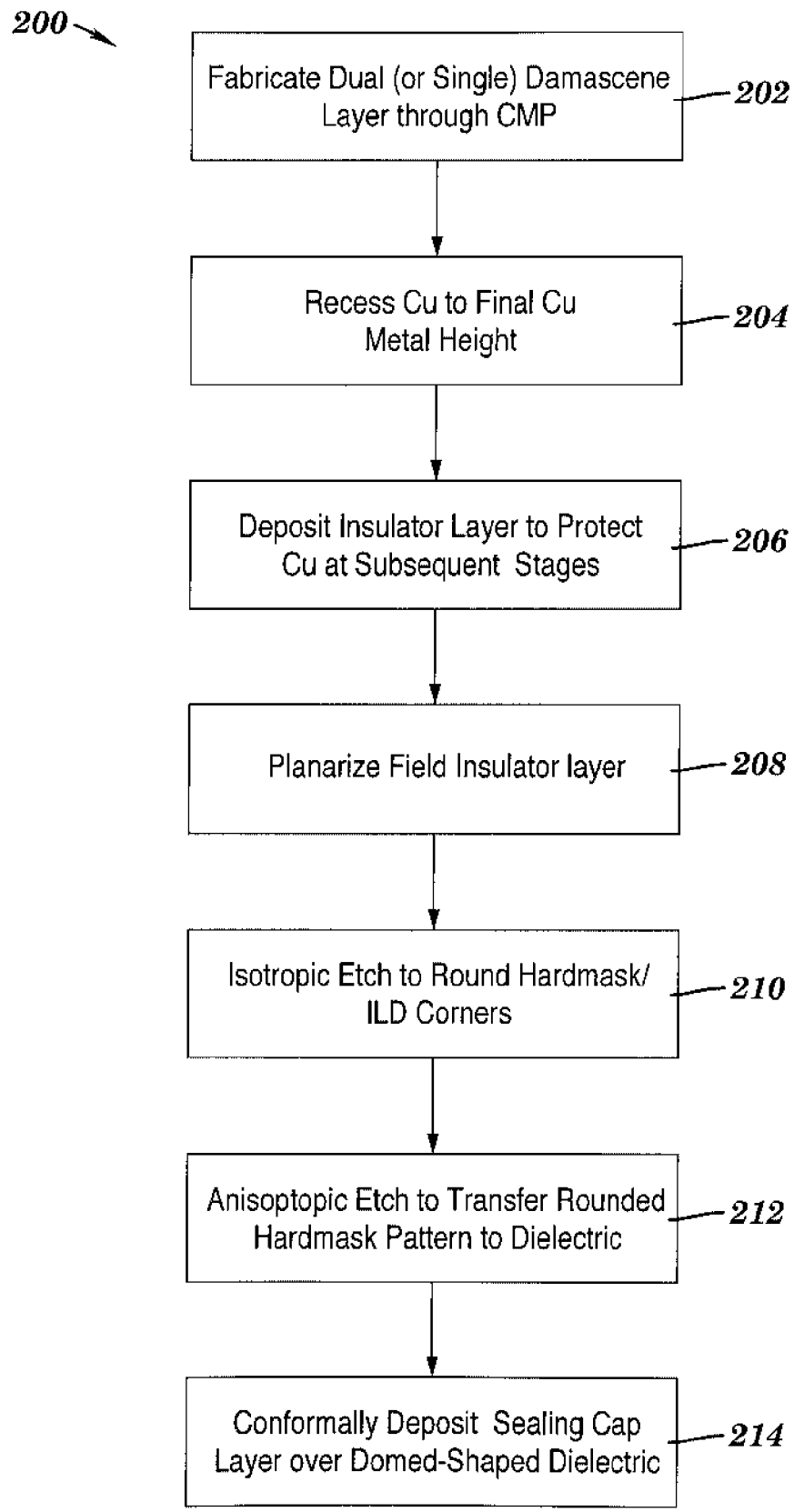
FIG. 2 process flow diagram illustrating a method for reducing lateral fringe capacitance in semiconductor devices.

Referring now to both the flow diagram 200 of FIG. 2 and the process sequence of FIGS. 3(a) through 3(g), a method of fabricating a domed capacitance structure is illustrated. Beginning in block 202 of FIG. 2 and FIG. 3(a), a dual (or single) damascene structure is fabricated up through a CMP operation. In particular, the ILD layer 302 has a hardmask layer 303 formed thereon, followed by the patterning of lines 304 that are filled by the conductive material (e.g., copper). The particular CMP process used to planarize the copper fill may or may not need to be altered in order to preserve the hardmask layer 303.

Figure 3A:
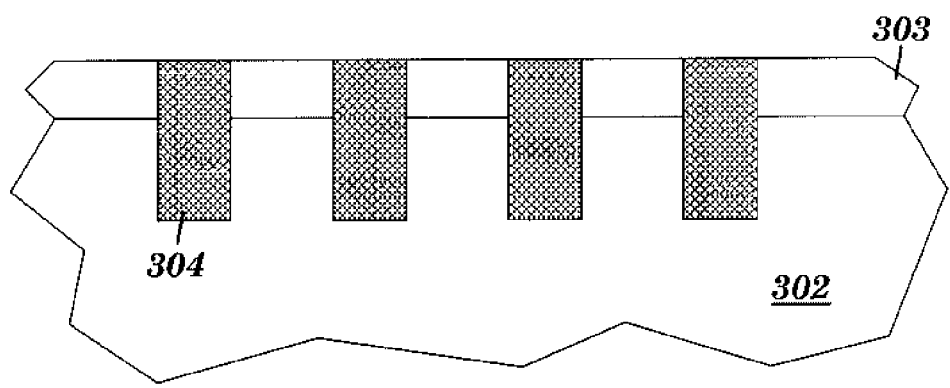
FIGS. 3(a) through 3(g) are cross sectional views of a semiconductor structure for reducing lateral fringe capacitance, in accordance with the method described in FIG. 2.
Figure 3B:
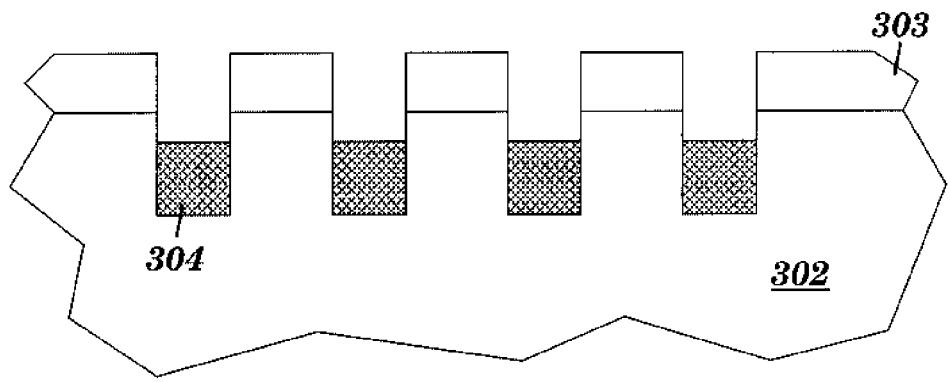
Figure 3C:
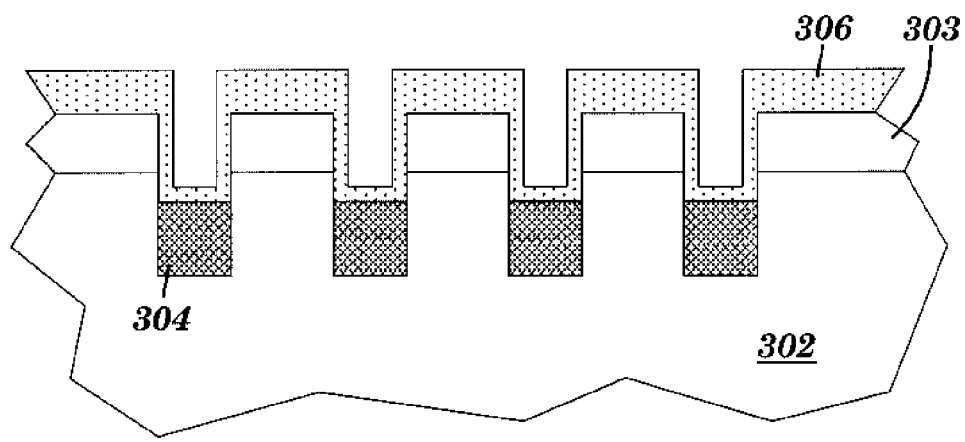
Figure 3D:
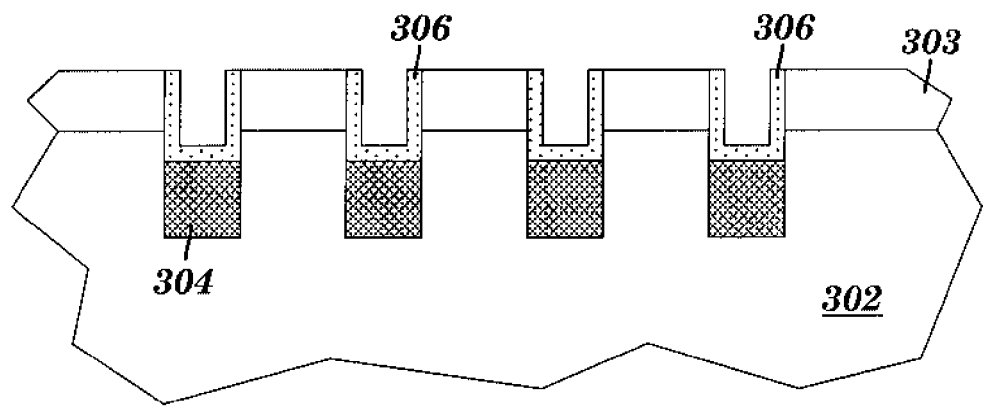

Then, as shown in block 204 of FIG. 2 and in FIG. 3(b), the copper fill material is recessed past the bottom of the hardmask layer 303 to its final height below the top of ILD layer 302. The recess step may be implemented through one or more of a variety of methods (such as wet etching, dry etching, CMP, etc.). At this stage, a non-conformal or conformal deposition of a protective insulator material 306 (e.g., $SiO_2$) is implemented, as shown in block 206 of FIG. 2 and in FIG. 3(c). A planarizing step is then carried out on the insulator material 306, down to the top of the hardrnask layer 303, as shown in block 208 of FIG. 2 and in FIG. 3(d). As a result, the U-shaped portions of the insulator material 306 provide a mechanism to protect the copper lines 304 during subsequent processing steps.

Figure 3E:
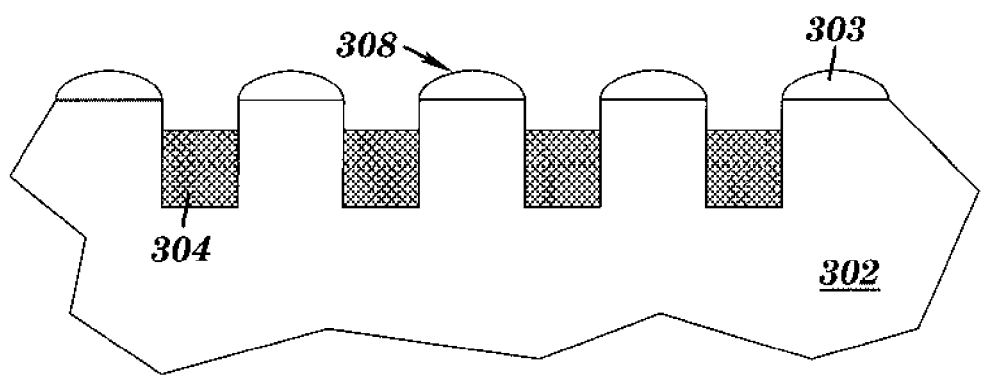
Figure 3F:
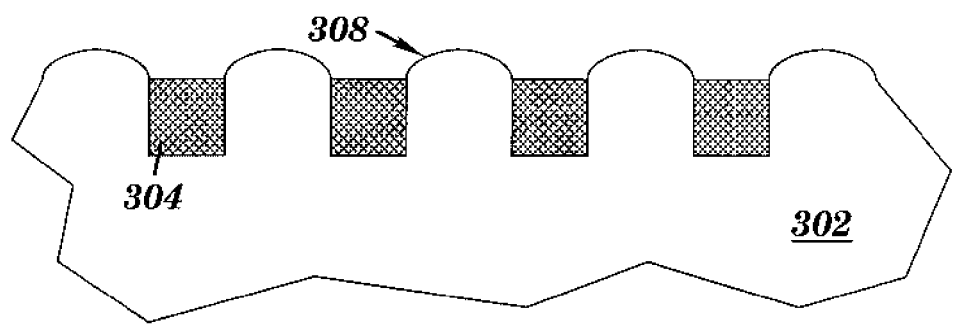

Referring next to block 210 of FIG. 2 and to FIG. 3(e), an isotropic (non-directional) etch is carried so as to both remove the sacrificial insulator material portions 306 and to shape the corners of the hardmask layer 303 into rounded, domed patterns 308. These domed patterns 308 are then transferred into the ILD layer 302 by an anisotropic (directional) etch, as shown in block 212 of FIG. 2 and in FIG. 3(f). Although the anisotropic transfer etch is depicted as a separate step in the Figures, the isotropic rounding etch and anisotropic transfer etches can be carried out in a single step.

Figure 1:
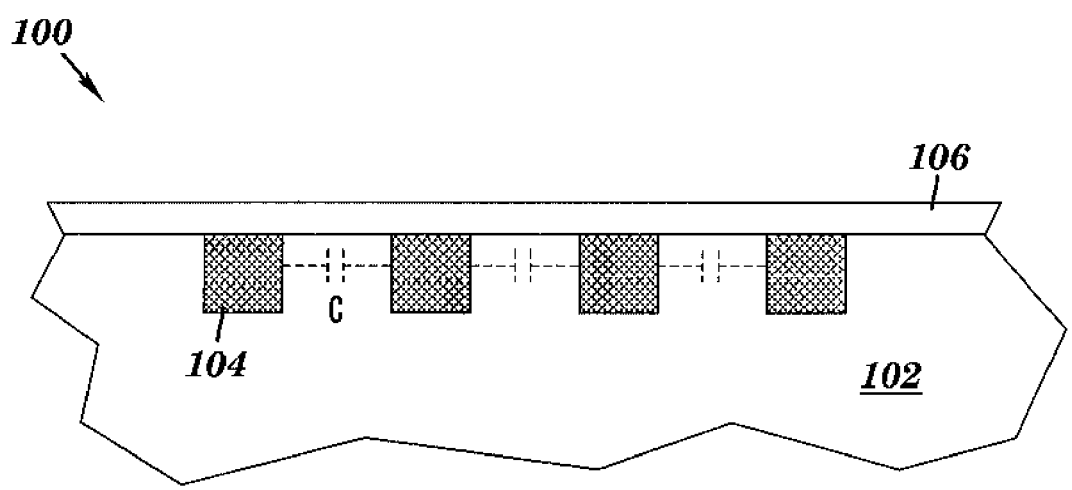
FIG. 1 is a cross sectional view of partially formed, conventional integrated circuit device.
Figure 3G:
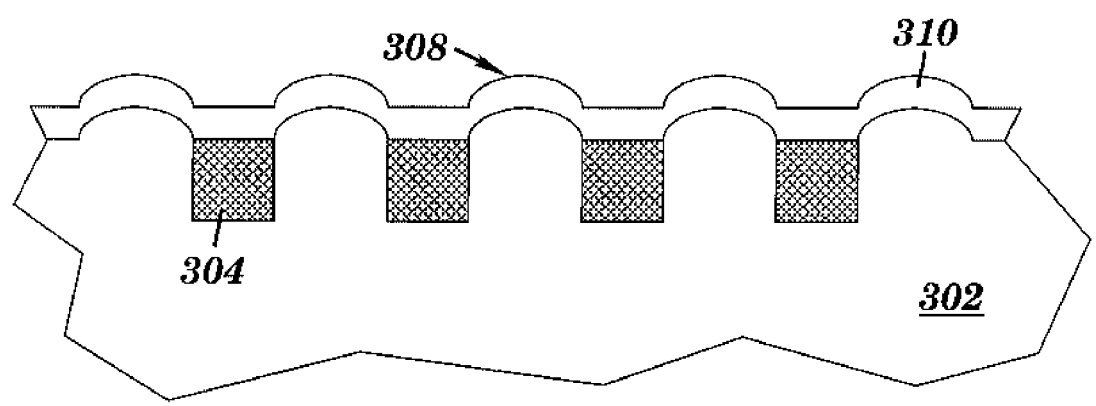

Finally, as shown in block 214 of FIG. 2 and in FIG. 3(g), a cap layer 310 (e.g., NBLoK) is conformally deposited over the non-planar structure, thus retaining the domed pattern 308. As compared to the conventional planar structure 100 of FIG. 1, the portions of the cap layer 310 between the lines 304 are arched in an upward direction, thereby physically distancing the higher-k layer from the lines. In turn, the overall lateral capacitance of the lines is reduced by about 5% due to the dome height.

It is desirable for the etch process to provide sharp corners during the fabrication of the single and dual damascene structure. Subsequent metallization on a rounded structure will tend to cause increased shorts as the burden is upon CMP to clear the liner residuals to the device manual tolerances. By fabricating the structure in the manner described above, the Cu-to-Cu spacing is maintained to design rule specifications while achieving the fabrication of a domed insulator spacing.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a semiconductor structure, the method comprising:
    defining a plurality of conductive lines within an interlevel dielectric (ILD) layer having a hardmask layer formed thereon;
    recessing fill material of the conductive lines to a level below the top of said ILD layer;
    forming a protective insulation layer over the top of said recessed fill material;
    defining a domed pattern within said hardmask layer, and thereby removing said protective insulation layer;
    removing said hardmask layer so as to transfer said domed pattern into the top of said ILD layer; and
    forming a cap layer over said ILD layer and said conductive lines, wherein said cap layer takes the form of said domed pattern.

2. The method of claim 1, wherein instances of said domed pattern are disposed between said conductive lines.

3. The method of claim 1, wherein said defining said domed pattern within said hardmask layer comprises isotropically etching said hardmask layer and said protective insulation layer.

4. The method of claim 3, wherein said transferring said domed pattern into the top of said ILD layer further comprises anisotropically etching said hardmask layer.

5. The method of claim 1, wherein said cap layer has a greater dielectric constant than said ILD layer.

6. The method of claim 5, wherein said ILD layer comprises silicon dioxide and said cap layer comprises nitrogen-doped silicon carbide.

7. The method of claim 1, wherein said forming said protective insulation layer over the top of said recessed fill material further comprises depositing a sacrificial insulating material and planarizing the insulating material down to said hardmask layer so as to form U-shaped portions of said insulating material on said conductive lines.

8. The method of claim 7, wherein said insulating material comprises silicon dioxide.

* * * * *